(12) United States Patent
Tanida et al.

(10) Patent No.: US 7,888,778 B2
(45) Date of Patent: Feb. 15, 2011

(54) SEMICONDUCTOR DEVICE AND PRODUCING METHOD OF THE SAME

(75) Inventors: Kazumasa Tanida, Kawasaki (JP); Masahiro Sekiguchi, Yokohama (JP); Ninao Sato, Mitaka (JP); Kenji Takahashi, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 12/207,288

(22) Filed: Sep. 9, 2008

(65) Prior Publication Data

US 2009/0065906 A1 Mar. 12, 2009

(30) Foreign Application Priority Data

Sep. 12, 2007 (JP) .............................. P2007-236637

(51) Int. Cl.
*H01L 23/52* (2006.01)
*H01L 21/4763* (2006.01)

(52) U.S. Cl. .............................. 257/621; 257/E23.141; 257/E21.495; 438/667

(58) Field of Classification Search .................. 257/621
See application file for complete search history.

(56) References Cited

U.S. PATENT DOCUMENTS

| | | | |
|---|---|---|---|
| 7,115,972 B2 | 10/2006 | Dotta et al. | |
| 7,276,780 B2 | 10/2007 | Dotta et al. | |
| 7,397,128 B2 | 7/2008 | Kubo et al. | |
| 7,535,062 B2 | 5/2009 | Maki et al. | |
| 7,646,079 B2 | 1/2010 | Umemoto | |
| 2002/0140083 A1* | 10/2002 | Matsuda | 257/711 |
| 2006/0001174 A1* | 1/2006 | Matsui | 257/774 |
| 2006/0022354 A1* | 2/2006 | Anzai | 257/786 |
| 2008/0237808 A1 | 10/2008 | Kubo et al. | |
| 2008/0303170 A1 | 12/2008 | Tanida et al. | |
| 2009/0194877 A1 | 8/2009 | Maki et al. | |

FOREIGN PATENT DOCUMENTS

JP 08-213427 8/1996

(Continued)

OTHER PUBLICATIONS

Tanida, Semiconductor Device and Method of Manufacturing Semiconductor Device, Jun. 7, 2007, G04-6929, FTK0804.*

(Continued)

*Primary Examiner*—Jarrett J Stark
*Assistant Examiner*—Lawrence Tynes, Jr.
(74) *Attorney, Agent, or Firm*—Turocy & Watson, LLP (57) ABSTRACT

A semiconductor device includes a semiconductor substrate having a through hole. An active layer is formed on a first surface of the semiconductor substrate. An inner wall surface of the through hole, a bottom surface of the through hole closed by the active layer and a second surface of the semiconductor substrate are covered with an insulating layer. A first opening is formed in the insulating layer which is present on the bottom surface of the through hole. A second opening is formed in the insulating layer which is present on the second surface of the semiconductor substrate. A first wiring layer is formed from within the through hole onto the second surface of the semiconductor substrate. A second wiring layer is formed to connect to the second surface through the second opening.

13 Claims, 6 Drawing Sheets

FOREIGN PATENT DOCUMENTS

| | | |
|---|---|---|
| JP | 2006-310726 | 11/2006 |
| JP | 2007-067216 | 3/2007 |
| JP | 2007-123719 | 5/2007 |
| JP | 2007-184449 | 7/2007 |
| JP | 2007-221080 | 8/2007 |
| WO | 2004/012274 | 2/2004 |

OTHER PUBLICATIONS

Tanida, et al., Semiconductor Device and Method of Manufacturing Semiconductor Device, pp. 1-49, Pending U.S. Appl. No. 12/134,363, filed Jun. 6, 2008.

* cited by examiner

SEMICONDUCTOR DEVICE AND PRODUCING METHOD OF THE SAME

CROSSREFERENCE TO RELATED APPLICATIONS

This application is based upon and claims the benefit of priority from the prior Japanese Patent Application No. 2007-236637, filed on Sep. 12, 2007; the entire contents of which are incorporated herein by reference.

BACKGROUND OF THE INVENTION

1. Field of the Invention

The present invention relates to a semiconductor device and a producing method of the same.

2. Description of the Related Art

A semiconductor device using a semiconductor integrated circuit may have semiconductor elements stacked into multiple layers. A through-connection (through electrode) is applied for electrical connection between the semiconductor elements stacked into the multiple layers. The through-connection is also applied to the electrical connection between the front and rear surfaces of the semiconductor element (semiconductor substrate). For example, the through-connection is formed by etching from the rear surface of the semiconductor substrate to form through holes and filling a conductive material into the through holes (See JP-B 3186941 (PATENT), JP-A 2007-123719(KOKAI)).

For example, the semiconductor device having the through-connection is produced as follows. First, a semiconductor substrate is provided with through holes by etching from its rear surface side to expose an active layer. Then, an insulating film is formed on the inner wall surfaces of the through holes and the rear surface of the semiconductor substrate, such that the film thickness on the rear surface side of the semiconductor substrate becomes larger than that on the bottom surfaces or inner wall surfaces of the through holes. Anisotropic etching is applied to an etch back process of the insulating film to expose the active layer by removing the insulating film which is on the bottom surfaces of the through holes. Thus, the through holes are formed to connect between the front and rear surfaces of the semiconductor substrate.

Then, a through wiring layer ranging from within the through holes onto the rear surface of the semiconductor substrate is formed to connect to the active layer through the through holes. The through wiring layer is formed on the rear surface of the semiconductor substrate while filling the through holes. Besides, the rear surface of the semiconductor substrate is covered with a protection film, openings are formed in the protection film to expose the through wiring layer, and an external connection terminal is formed in the openings. The semiconductor device is formed in plural in a grid pattern on the semiconductor wafer and lastly singulated by cutoff.

Since a conventional semiconductor device having the through-connection has the rear surface of the semiconductor substrate covered with the insulating film, it is necessary to connect the semiconductor substrate to the ground through the active layer and the through wiring layer on the front surface side. Therefore, the improvement of the operation property of the device is limited. In addition, since the rear surface of the semiconductor substrate is covered with the insulating film and the protection film, heat dissipation from the rear surface of the semiconductor substrate is also limited, and there is a problem that the operation of the device having high heat generation is limited.

Besides, if adhesiveness between the semiconductor substrate and the insulating film which is formed on the rear surface of the semiconductor substrate is low, there is a possibility of delaminating the insulating film when the semiconductor wafer is cut to singulate the semiconductor device. In other words, when the semiconductor wafer is cut, delamination tends to take place from the interface between the insulating film and the semiconductor substrate exposed on the cut surface of the semiconductor substrate, causing a problem that the mechanical reliability is degraded.

SUMMARY OF THE INVENTION

A semiconductor device according to a first aspect of the present invention includes: a semiconductor substrate having a first surface and a second surface which is positioned on the opposite side of the first surface; a through hole which is formed in the semiconductor substrate to connect the first surface and the second surface; an active layer which is formed on the first surface of the semiconductor substrate to close the through hole; an insulating layer which covers an inner wall surface of the through hole, a bottom surface of the through hole which is closed by the active layer and the second surface of the semiconductor substrate; a first opening which is formed in the insulating layer which is present on the bottom surface of the through hole to expose the active layer; a second opening which is formed in the insulating layer which is present on the second surface of the semiconductor substrate to expose the second surface; a first wiring layer which is formed via the insulating layer ranging from within the through hole onto the second surface of the semiconductor substrate to connect to the active layer through the first opening; and a second wiring layer which is formed on the second surface of the semiconductor substrate to connect to the second surface through the second opening.

A semiconductor device according to a second aspect of the present invention includes: a semiconductor substrate having a first surface and a second surface which is positioned on the opposite side of the first surface; a through hole which is formed in the semiconductor substrate to connect the first surface and the second surface; an active layer which is formed on the first surface of the semiconductor substrate to close the through hole; an insulating layer which covers an inner wall surface of the through hole, a bottom surface of the through hole which is closed by the active layer and the second surface of the semiconductor substrate; a first opening which is formed in the insulating layer which is present on the bottom surfaces of the through hole to expose the active layer; a first wiring layer which is formed via the insulating layer ranging from within the through hole onto the second surface of the semiconductor substrate to connect to the active layer through the first opening; and a second wiring layer which is formed on the second surface of the semiconductor substrate via the insulating layer to surround the first wiring layer which is present on the second surface of the semiconductor substrate.

A method for producing a semiconductor device according to an aspect of the present invention includes: forming an active layer on a first surface of a semiconductor substrate; forming a through hole in the semiconductor substrate from a second surface which is on the opposite side of the first surface of the semiconductor substrate toward the first surface to expose the active layer; forming an insulating layer to cover an inner wall surface of the through hole, a bottom surface of the through hole which is closed by the active layer and the second surface of the semiconductor substrate; forming a first opening to expose the active layer by partially removing the insulating layer which is present on the bottom surface of the through hole; forming second openings to expose the second surface of the semiconductor substrate by partially removing the insulating layer which is present on the second surface of the semiconductor substrate; forming a first wiring layer via the insulating layer ranging from within the through hole onto the second surface of the semiconductor substrate to connect to the active layer through the first opening; and forming a second wiring layer on the second surface of the semiconductor substrate to connect to the second surface through the second opening.

DETAILED DESCRIPTION OF THE INVENTION

Modes of conducting the present invention will be described below with reference to the drawings.

Figure 1:
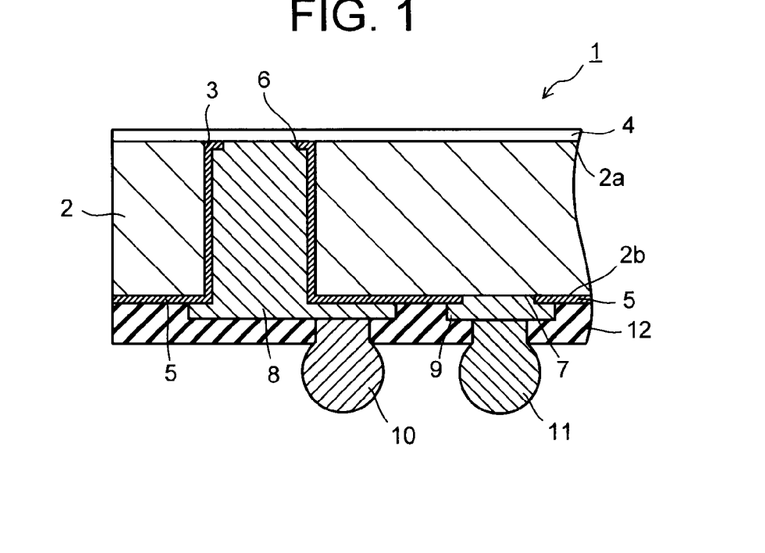
FIG. 1 is a sectional view showing a semiconductor device according to a first embodiment of the present invention.

FIG. 1 shows a semiconductor device according to a first embodiment of the present invention. A semiconductor device 1 shown in FIG. 1 has a semiconductor substrate 2. For example, a silicon (Si) substrate is used for the semiconductor substrate 2. The semiconductor substrate 2 has a first surface 2a and a second surface 2b which is on the opposite side to the first surface. The first surface (front surface) 2a becomes a surface on which integrated circuits including photodiodes and transistors, wirings, electrodes and the like are formed. The second surface (rear surface) 2b becomes a surface on which external connection terminals are formed.

The semiconductor substrate 2 has a through hole 3 for connecting the first surface 2a and the second surface 2b. An active layer 4 is formed on the first surface 2a of the semiconductor substrate 2. The active layer 4 is formed to close an opening of the through hole 3. In other words, the active layer 4 is exposed to the through hole 3, and the bottom surface of the through hole 3 is configured of the active layer 4. The active layer 4 includes semiconductor elements such as transistors, resistors, capacitors and the like and a conductive layer which is electrically connected to them, and the like.

The inner wall surface (side surface) of the through hole 3 and the bottom surface of the through hole 3 which is closed by the active layer 4 are covered with an insulating layer 5. In addition, a first opening 6 having a diameter smaller than the opening diameter of the through hole 3 is provided in the insulating layer 5, which is present on the bottom surface of the through hole 3, to expose the active layer 4. The first opening 6 is formed by partially removing the insulating layer 5 which is present on the bottom surface of the through hole 3. Besides, a second opening 7 is formed in the insulating layer 5, which is present on the second surface 2b of the semiconductor substrate 2, to expose the second surface 2b. The second opening 7 is formed by partially removing the insulating layer 5 which is present on the second surface 2b.

A conductive material which becomes a first wiring layer 8 is filled into the through hole 3 via the insulating layer 5. Since the first opening 6 is formed in the insulating layer 5 which is present on the bottom surface of the through hole 3, the first wiring layer 8 is connected to the active layer 4 through the first opening 6. The first wiring layer 8 is formed ranging from within the through hole 3 onto the second surface 2b of the semiconductor substrate 2. The first wiring layer 8 is partially formed on the second surface 2b of the semiconductor substrate 2 via the insulating layer 5. The first wiring layer 8 is a through wiring layer for connecting the first surface 2a and the second surface 2b of the semiconductor substrate 2.

Besides, a second wiring layer 9 which is connected to the second surface 2b through the second opening 7 is provided as a ground wiring or the like on the second surface 2b of the semiconductor substrate 2. The second wiring layer 9 is partially formed on the insulating layer 5. The second wiring layer 9 which is provided on the insulating layer 5 of the second surface 2b is connected to the second surface 2b through the second opening 7. The second wiring layer 9 is electrically connected to the semiconductor substrate 2. The second wiring layer 9 is preferably in ohmic contact with the second surface 2b of the semiconductor substrate 2.

The first wiring layer 8 is provided with a first external connection terminal 10. The second wiring layer 9 is provided with a second external connection terminal 11. The second surface 2b of the semiconductor substrate 2 is covered with a protective layer 12 excepting the first and second external connection terminals 10, 11. The insulating layer 5 and the wiring layers 8, 9 on the second surface 2b are covered with the protective layer 12. The protective layer 12 may be formed to cover at least the first and second wiring layers 8, 9.

Figure 2:
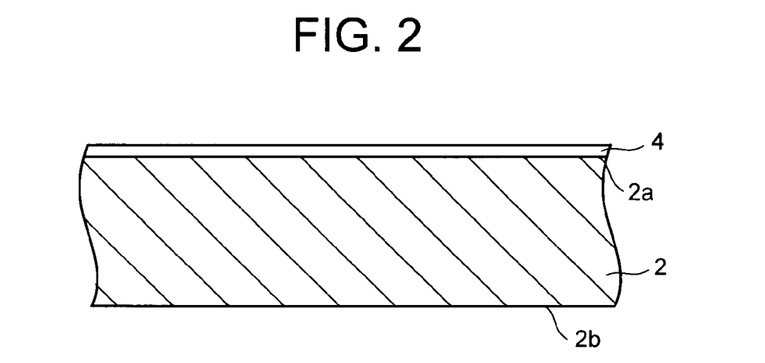
FIG. 2 is a diagram showing a stage of forming an active layer in a production process of the semiconductor device shown in FIG. 1.

For example, the semiconductor device 1 of the first embodiment is produced as follows. First, the active layer 4 including the semiconductor elements such as transistors, resistors, capacitors and the like and the conductive layer is formed on the first surface 2a of the semiconductor substrate 2 as shown in FIG. 2. The semiconductor substrate 2 is supplied as a semiconductor wafer, and the active layer 4 is formed depending on the individual device configuration regions of the semiconductor wafer. For the conductive layer, a high-resistance metallic material (Ti, TiN, TiW, Ni, Cr, TaN, CoWP or the like) or a low-resistance metallic material (Al, Al—Cu, Al—Si—Cu, Cu, Au, Ag or the like) is used. They are used in a single layer structure or a multilayer structure having plural material layers stacked to configure the conductive layer.

Figure 3:
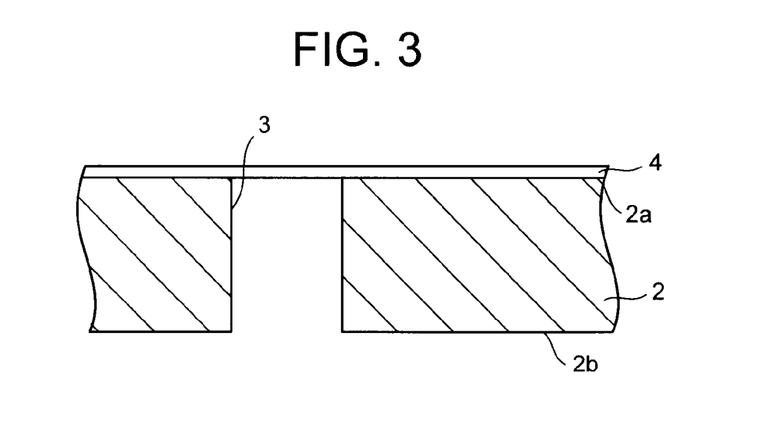
FIG. 3 is a diagram showing a stage of forming a through hole in the production process of the semiconductor device shown in FIG. 1.

Then, as shown in FIG. 3, the through hole 3 is formed from the second surface 2b of the semiconductor substrate 2 toward the first surface 2a to expose the active layer 4 in the through hole 3. The through hole 3 is formed by etching the semiconductor substrate 2 by a plasma etching method or the like using a mask (not shown) having a prescribed pattern arranged on the second surface 2b of the semiconductor substrate 2. The through hole 3 has, for example, a protruded cross-sectional shape near the active layer 4 toward the first surface 2a. The plasma etching is generally performed by introducing an etching gas (for example, a mixture gas of $SF_6$, $O_2$, Ar when the semiconductor substrate 2 is formed of an Si substrate) into plasma.

The through hole 3 may be formed by a laser etching method. In such a case, the mask is unnecessary. As the etching laser light source, for example, a YAG (Yttrium•Aluminum•Garnet) laser, a UV (solid ultraviolet) laser, an excimer laser, a carbon dioxide ($CO_2$) laser or the like is used. The YAG laser has a wavelength of 355 nm, the UV laser has wavelengths of 213 nm and 266 nm (CLBO: cesium lithium borate crystal), 355 nm (CBO: cesium triborate crystal, LBO: lithium triborate crystal), and the excimer laser has wavelengths of 193 nm (ArF), 248 nm (KrF), 308 nm (XeCl), 351 nm (XeF). In a case where the semiconductor substrate 2 is an Si substrate, the YAG laser (wavelength: 355 nm) is preferably applied as the laser light source.

Figure 4:
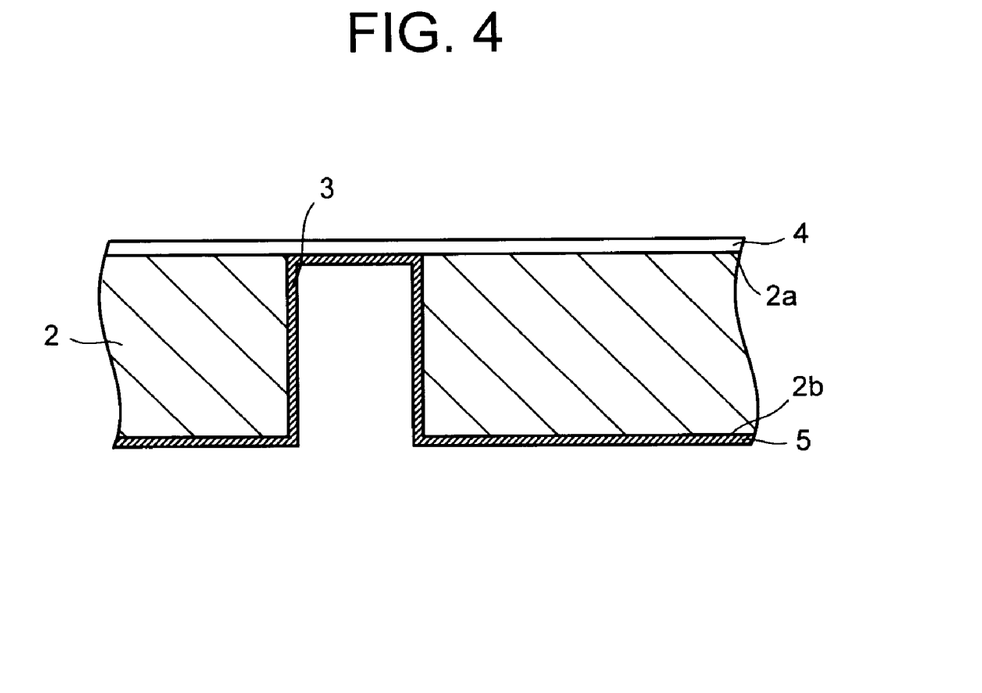
FIG. 4 is a diagram showing a stage of forming an insulating layer in the production process of the semiconductor device shown in FIG. 1.

As shown in FIG. 4, the insulating layer 5 is formed to cover the inner wall surface of the through hole 3, the bottom surface of the through hole 3 closed by the active layer 4 and the second surface 2b of the semiconductor substrate 2 by applying a CVD method, a spray coating method, a spin coating method, a film laminating method or the like. For example, the insulating layer 5 is configured of an inorganic insulating film such as a silicon oxide film or a silicon nitride film or an organic insulating film such as a polyimide resin film, a BCB (benzocyclobutane) film or an epoxy resin film.

Figure 5:
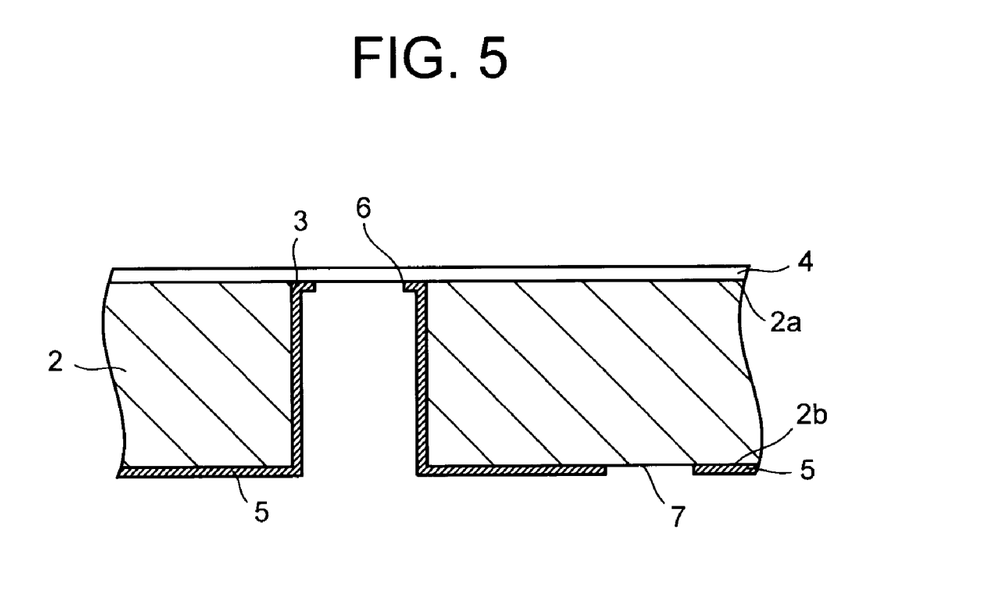
FIG. 5 is a diagram showing a stage of forming an opening in the insulating layer in the production process of the semiconductor device shown in FIG. 1.

Then, as shown in FIG. 5, the first opening 6 is formed by partially removing the insulating layer 5, which covers the active layer 4 corresponding to the bottom surface of the through hole 3, by an area smaller than the opening diameter of the through hole 3 using a mask (not shown) having a prescribed pattern by plasma etching to expose the active layer 4 within the through hole 3. When the first opening 6 is formed, the second opening 7 is simultaneously formed using the same mask by partially removing the insulating layer 5 which is present on the second surface 2b of the semiconductor substrate 2 to expose the second surface 2b of the semiconductor substrate 2 within the second opening 7. In a case where the insulating layer 5 is configured of an $SiO_2$ film, a mixture gas of, for example, $C_5F_8$, $O_2$, Ar is used as the etching gas.

The insulating layer 5 may be removed by applying the laser etching method. In such a case, the mask is unnecessary. The laser light source applicable to the laser etching is as described above. For example, in a case where the insulating layer 5 configured of the organic insulating film is finely fabricated (opened), the UV laser (wavelength: 266 nm) is preferably used. Here, the first opening 6 and the second opening 7 are formed by the same process, but the first opening 6 and the second opening 7 may be formed by a different process. But, to reduce the production man-hour and production cost of the semiconductor device 1, the first opening 6 and the second opening 7 are preferably formed by the same process.

Figure 6:
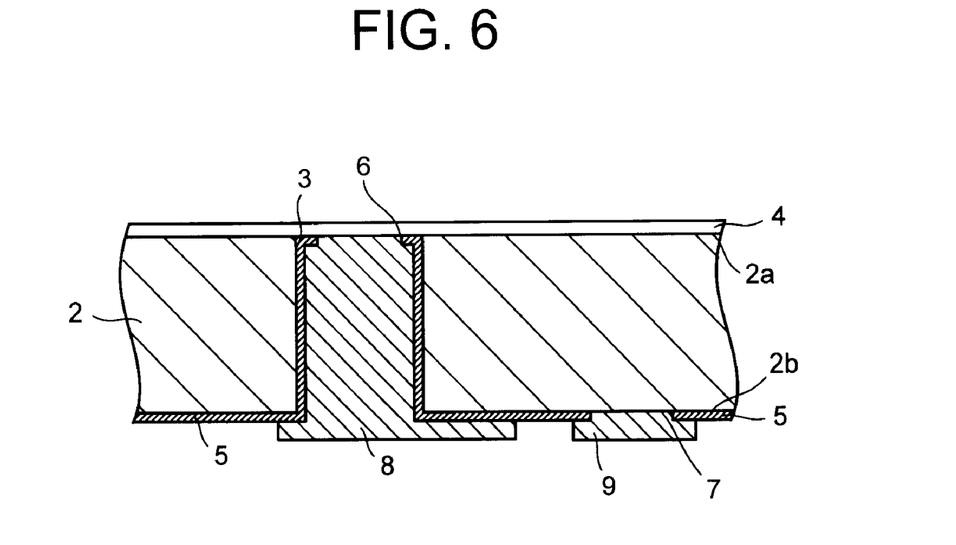
FIG. 6 is a diagram showing a stage of forming a wiring layer in the production process of the semiconductor device shown in FIG. 1.

Subsequently, the first wiring layer 8 is formed ranging from within the through hole 3 onto the second surface 2b of the semiconductor substrate 2 as shown in FIG. 6. The first wiring layer 8 is formed within the through hole 3 and on the second surface 2b of the semiconductor substrate 2 via the insulating layer 5. Since the first opening 6 is previously provided in the insulating layer 5 which is present on the bottom surface of the through hole 3, the first wiring layer 8 is connected to the active layer 4 through the first opening 6. The first wiring layer 8 is formed using a mask (not shown) having a prescribed pattern by applying a sputtering method, a CVD method, a deposition method, a plating method, a printing method or the like. At the same time, the same mask is used to form the second wiring layer 9 on the second surface 2b of the semiconductor substrate 2. The second wiring layer 9 is formed to connect to the second surface 2b through the second opening 7.

For the first and second wiring layers 8, 9, for example, a high-resistance metallic material (Ti, TiN, TiW, Ni, Cr, TaN, CoWP or the like) or a low-resistance metallic material (Al, Al—Cu, Al—Si—Cu, Cu, Au, Ag, a solder material or the like) is used. They are used in a single layer structure or a multilayer structure having plural material layers stacked to configure a conductive layer. Here, the first wiring layer 8 and the second wiring layer 9 are formed by the same process, but the first wiring layer 8 and the second wiring layer 9 may be formed by a different process. But, to reduce the production man-hour and production cost of the semiconductor device 1, the first wiring layer 8 and the second wiring layer 9 are preferably formed by the same process.

Figure 7:
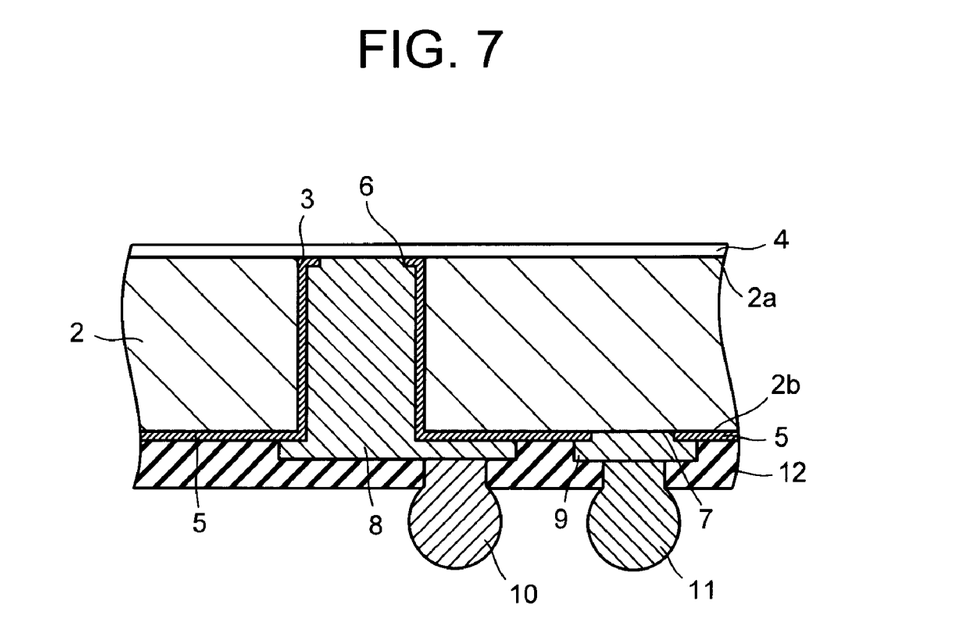
FIG. 7 is a diagram showing a stage of forming external connection terminals and a protective layer in the production process of the semiconductor device shown in FIG. 1.

Then, the first and second external connection terminals 10, 11 are formed on the first and second wiring layers 8, 9 as shown in FIG. 7. The protective layer 12 is formed to cover the second surface 2b of the semiconductor substrate 2 excepting the external connection terminals 10, 11. The insulating layer 5 and the wiring layers 8, 9 which are present on the second surface 2b are covered with the protective layer 12. The external connection terminals 10, 11 are formed of, for example, a solder material. The protective layer 12 is formed of polyimide resin, epoxy resin, or a solder resist material. After the series of processes (wafer process) have completed, the semiconductor substrate 2 is singulated by cutting with the blade to produce the semiconductor device 1 shown in FIG. 1.

Figure 8:
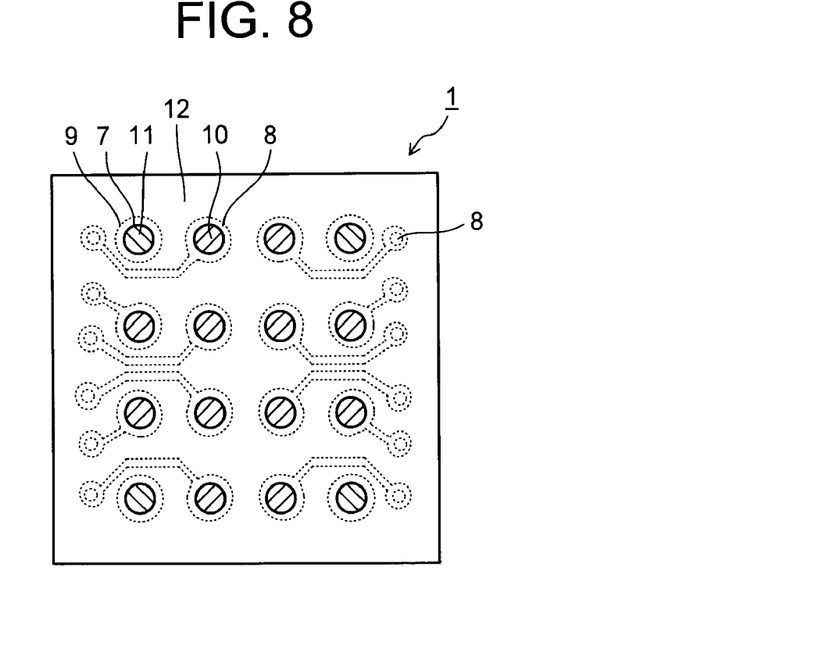
FIG. 8 is a rear surface view of the semiconductor device shown in FIG. 1.

FIG. 8 is a rear surface view (planar view when viewed from the side of the second surface 2b) of the semiconductor device 1. The second external connection terminals 11 provided on the second wiring layers 9 function as ground terminals of the semiconductor substrate 2. The second external connection terminal 11 is arranged coaxially with the second opening 7. The second external connection terminal 11 may be arranged offset from the second opening 7 by routing the second wiring layer 9 on the second surface 2b of the semiconductor substrate 2.

In the semiconductor device 1 of the first embodiment, the second opening 7 is formed on the insulating layer 5 which is present on the second surface 2b of the semiconductor substrate 2, and the second wiring layer 9 which is electrically connected to the exposed portion of the second surface 2b of the semiconductor substrate 2 through the second opening 7 is provided. The second wiring layer 9 can be used as a ground wiring to directly connect the second external connection terminal 11 as a ground terminal to the second surface 2b of the semiconductor substrate 2. Therefore, noise generation or the like is suppressed. Besides, heat can be radiated from the second surface 2b of the semiconductor substrate 2 via the second wiring layer 9. Thus, it becomes possible to provide the semiconductor device 1 with the device characteristics improved.

Figure 9:
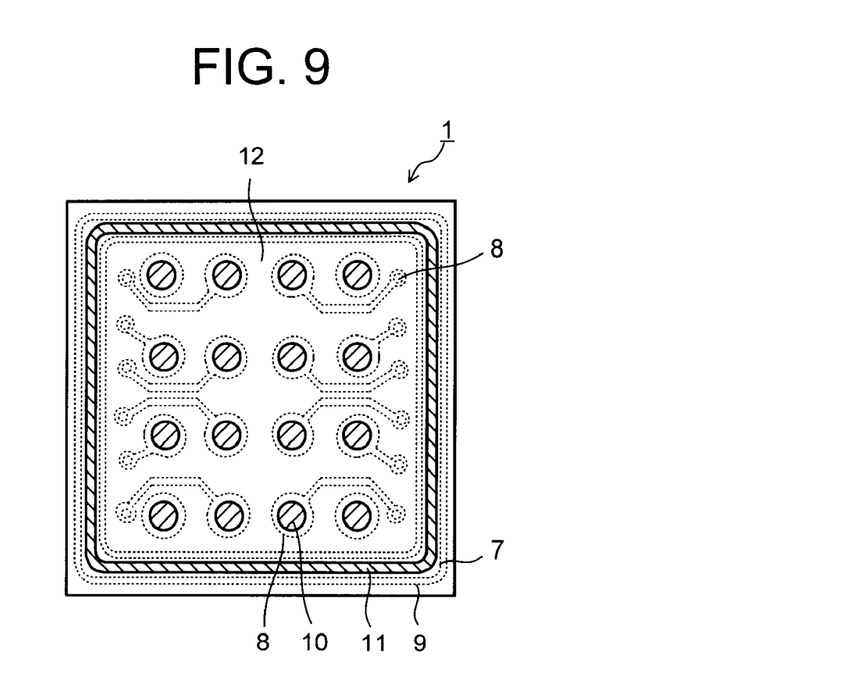
FIG. 9 is a rear surface view showing a modified example of the semiconductor device shown in FIG. 1.

FIG. 9 is a rear surface view showing a modified example of the semiconductor device 1 according to the first embodiment. In the semiconductor device 1 shown in FIG. 9, the second wiring layer 9 is provided in a rectangular shape to surround the first wiring layers 8 on the second surface 2b of the semiconductor substrate 2. The second external connection terminal 11 provided on the second wiring layer 9 has substantially the same shape (rectangular shape) as the second wiring layer 9 to surround the first external connection terminals 10 provided on the first wiring layers 8.

Since the second wiring layer 9 and the second external connection terminal 11 surround the first wiring layers 8 and the first external connection terminals 10, they function as shields for them. The first wiring layers 8 and the first external connection terminals 10 which are shielded by the second wiring layer 9 and the second external connection terminal 11 are provided with improved signal characteristics. Thus, the semiconductor device 1 with the device characteristics further improved can be provided. The second wiring layer 9 and the second external connection terminal 11 which function as the shields are connected to the second surface 2b of the semiconductor substrate 2 through the second opening 7.

In the semiconductor device 1 shown in FIG. 9, the second opening 7 has a shape that the insulating layer 5 which is present on the second surface 2b of the semiconductor substrate 2 is removed in a rectangular shape so as to have the same shape as the second wiring layer 9. The shape of the second opening 7 is not limited to the above and may have a shape that the insulating layer 5 of the area where the second wiring layer 9 is formed is partially (e.g., circular) removed. Besides, in a case where the semiconductor device 1 is mounted on a substrate or the like, the second external connection terminal 11 is connected to the substrate wiring together with the first external connection terminal 10, so that it is desired that the second external connection terminal 11 has the same height as the first external connection terminal 10.

Figure 10:
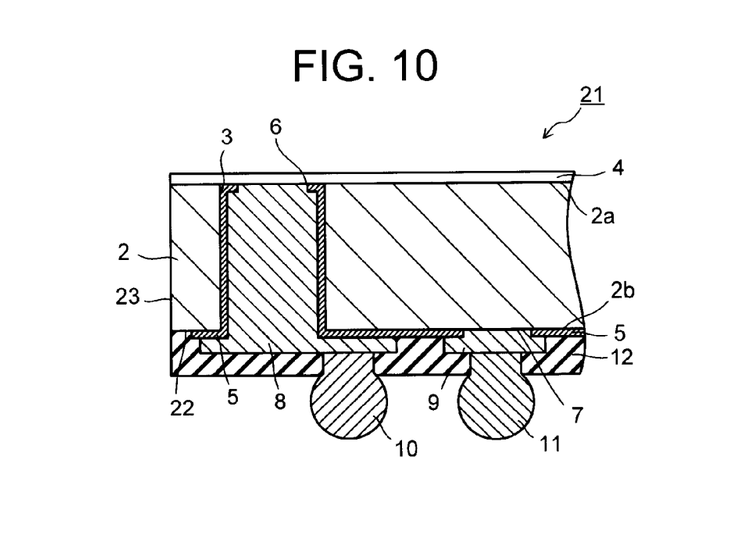
FIG. 10 is a sectional view showing a semiconductor device according to a second embodiment of the present invention.

Then, a semiconductor device according to a second embodiment of the present invention is described below with reference to FIG. 10. FIG. 10 is a sectional view showing a structure of a semiconductor device 21 of the second embodiment. In the semiconductor device 21 shown in FIG. 10, a third opening 22 is formed in the insulating layer 5, which is present on the second surface 2b of the semiconductor substrate 2, in addition to the second opening 7. The third opening 22 is formed in the insulating layer 5 to expose a peripheral edge portion (outer peripheral portion) of the second surface 2b of the semiconductor substrate 2. Other structures (the first opening 6, the wiring layers 8, 9, etc.) are same as in the first embodiment. In FIG. 10, like component parts corresponding to those of FIG. 1 are denoted by like reference numerals.

The third opening 22 is formed on the second surface 2b side of a side surface (cut surface) 23 of the semiconductor substrate 2, namely in the peripheral edge portion of the second surface 2b, by removing the insulating layer 5 which is positioned at that portion. The peripheral edge portion of the second surface 2b is exposed from the third opening 22. The exposed portion of the peripheral edge portion of the second surface 2b contributes to suppression of a defect occurrence (defective delamination of the insulating layer 5) at the time of cutting.

The second surface 2b of the semiconductor substrate 2 is covered with the protective layer 12 excepting the first and second external connection terminals 10, 11. A peripheral edge portion (portion corresponding to the third opening 22) of the second surface 2b where the insulating layer 5 is removed is covered with the protective layer 12. Namely, the protective layer 12 has a side surface (cut surface) which has substantially the same level of flatness as the side surface (cut surface) 23 of the semiconductor substrate 2.

Figure 11:
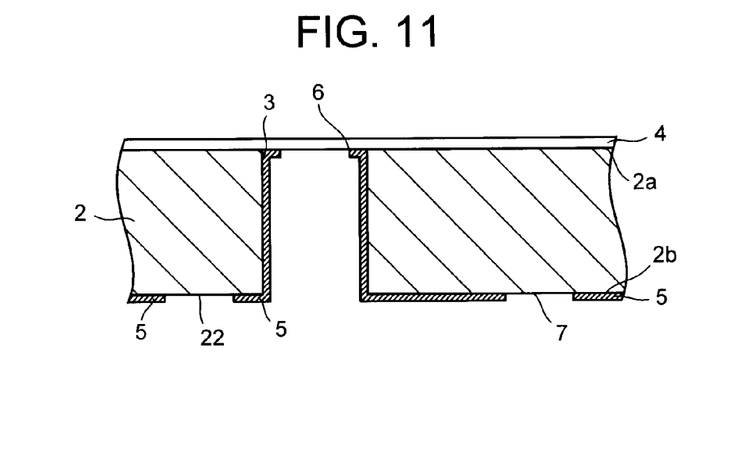
FIG. 11 is a diagram showing a stage of forming openings in an insulating layer in a production process of the semiconductor device shown in FIG. 10.

For example, the semiconductor device 21 of the second embodiment is produced as follows. First, the semiconductor substrate 2 is subjected to a process of forming the active layer 4, a process of forming the through hole 3, and a process of forming the insulating layer 5 in the same manner as in the first embodiment. Such states are as shown in FIG. 4. Then, as shown in FIG. 11, the first opening 6 is formed to expose the active layer 4 within the through hole 3 by partially removing the insulating layer 5, which covers the active layer 4 corresponding to the bottom surface of the through hole 3, by an area smaller than the opening diameter of the through hole 3 using a mask (not shown) having a prescribed pattern by plasma etching.

When the first opening 6 is formed, the second opening 7 and the third opening 22 are simultaneously formed using the same mask by partially removing the insulating layer 5 which is present on the second surface 2b of the semiconductor substrate 2. Thus, the second surface 2b of the semiconductor substrate 2 is exposed within the second opening 7, and the peripheral edge portion of the second surface 2b is exposed from the third opening 22. The third opening 22 is formed to include the cut region of the semiconductor substrate 2. The insulating layer 5 may be etched by applying the laser etching in the same manner as in the first embodiment.

Figure 12:
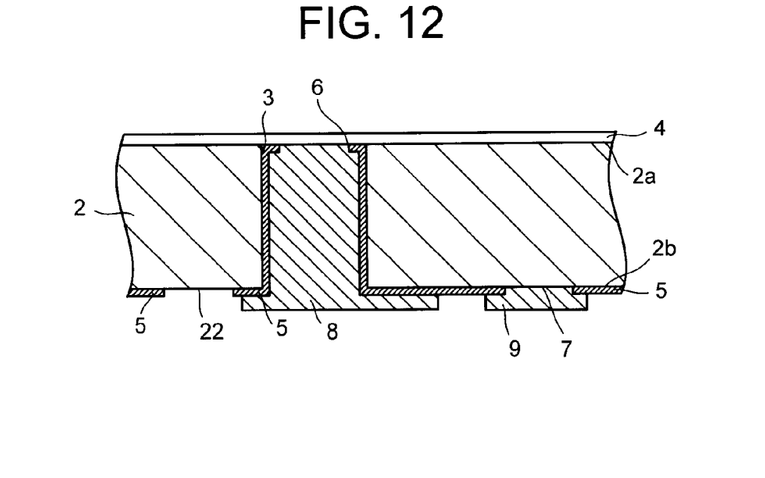
FIG. 12 is a diagram showing a stage of forming wiring layers in the production process of the semiconductor device shown in FIG. 10.
Figure 13:
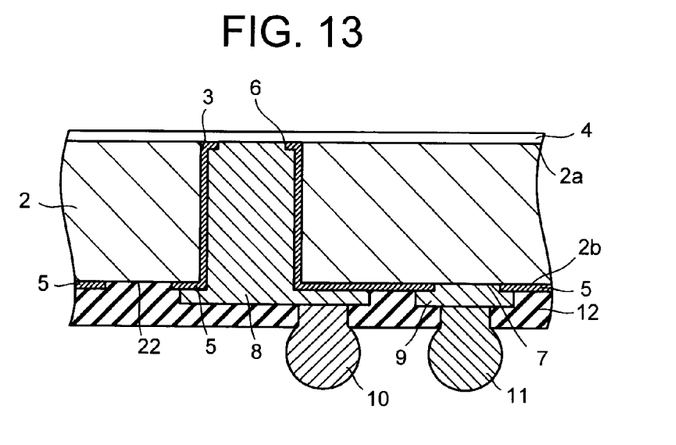
FIG. 13 is a diagram showing a stage of forming external connection terminals and a protective layer in the production process of the semiconductor device shown in FIG. 10.

Then, the first and second wiring layers 8, 9 are formed as shown in FIG. 12. Next, the first and second external connection terminals 10, 11 are respectively formed on the first and second wiring layers 8, 9 as shown in FIG. 13. And, the protective layer 12 is formed to cover the second surface 2b of the semiconductor substrate 2 excepting the external connection terminals 10, 11. The third opening 22 is covered with the protective layer 12. After the series of processes (wafer process) have completed, the semiconductor substrate 2 is singulated by cutting with the blade. The semiconductor substrate 2 is cut along the center of the third opening 22 by blade dicing. Thus, the semiconductor device 21 shown in FIG. 10 is produced.

In the semiconductor device 21 of the second embodiment, a defect-suppressing effect when the semiconductor substrate 2 is singulated by cutting can be obtained in addition to the same effects (improvement effect of the device characteristics involved in noise reduction and improvement of a heat dissipation property) as in the first embodiment. In other words, since the peripheral edge portion of the second surface 2b of the semiconductor substrate 2 is determined to be the third opening 22 by removing the insulating layer 5, a defect occurrence due to delamination of the insulating layer 5 when the semiconductor substrate 2 is cut and delamination of the insulating layer 5 from the end surface when the semiconductor device 21 is used can be suppressed. Therefore, it becomes possible to provide the semiconductor device 21 which is provided with the improved production yield and mechanical reliability.

Figure 14:
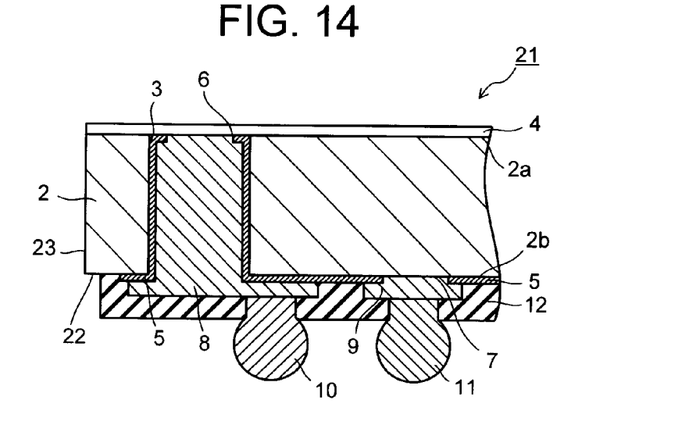
FIG. 14 is a sectional view showing a modified example of the semiconductor device shown in FIG. 10.

FIG. 14 shows a modified example of the semiconductor device 21 according to the second embodiment. In the semiconductor device 21 shown in FIG. 14, the third opening 22 is formed in the peripheral edge portion of the second surface 2b of the semiconductor substrate 2. The protective layer 12 which covers the second surface 2b of the semiconductor substrate 2 is retreated from the side surface (cut surface) 23 of the semiconductor substrate 2 so that its end surface is positioned within the third opening 22. Namely, the protective layer 12 is formed to cover the insulating layer 5 of the second surface 2b and also to expose the second surface 2b within the third opening 22. The application of the protective layer 12 can effectively suppress a defect occurrence due to the delamination of the insulating layer 5 or the protective layer 12 at the time of cutting or delamination from the end surface when the semiconductor device 21 is used.

Figure 15:
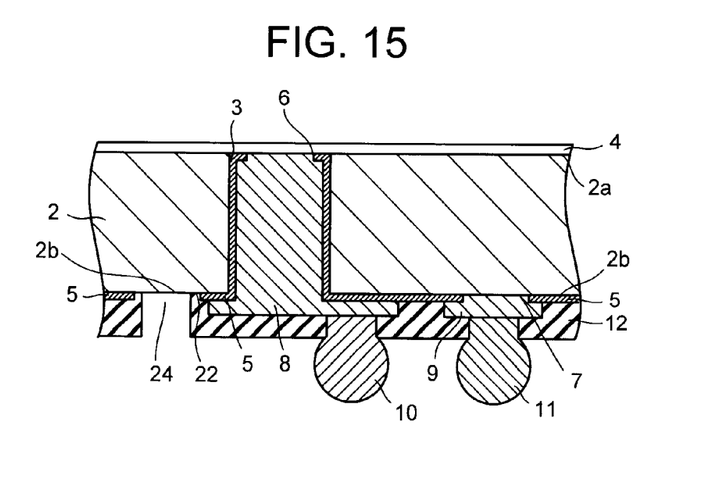
FIG. 15 is a diagram showing a stage of forming external connection terminals and a protective layer in the production process of the semiconductor device shown in FIG. 14.

For example, the semiconductor device 21 shown in FIG. 14 is produced as follows. First, similar to the production process of the semiconductor device 21 shown in FIG. 10, the semiconductor substrate 2 is subjected to a process of forming the active layer 4, a process of forming the through hole 3, a process of forming the insulating layer 5, and a process of forming the wiring layers 8, 9. Such states are as shown in FIG. 12. Then, as shown in FIG. 15, the first and second external connection terminals 10, 11 are respectively formed on the first and second wiring layers 8, 9. And, the second surface 2b of the semiconductor substrate 2 is covered with the protective layer 12 excepting the external connection terminals 10, 11.

An opening 24 is formed in a position corresponding to the peripheral edge portion of the second surface 2b of the protective layer 12. The opening 24 of the protective layer 12 is formed coaxially with and smaller than the third opening 22 of the insulating layer 5. In other words, the protective layer 12 is formed to cover the insulating layer 5 and also to expose a portion corresponding to the peripheral edge portion of the second surface 2b of the semiconductor substrate 2. After the series of processes (wafer process) have completed, the semiconductor substrate 2 is singulated by cutting with the blade. At this time, the semiconductor substrate 2 is cut along the center of the opening 24 of the protective layer 12 by blade dicing to obtain the protective layer 12 which has retreated from the cut surface (side surface 23) of the semiconductor substrate 2.

The present invention is not limited to the above-described embodiments but can also be applied to various types of semiconductor devices which connect the front and rear surfaces of the semiconductor substrate by the through wiring layer and also form the insulating layer and the wiring layer on the second surface (rear surface) of the semiconductor substrate. Such semiconductor devices are also included in the present invention. The embodiments of the present invention can be expanded or modified within the scope of technical idea of the invention, and the expanded and modified embodiments are also included in the technical scope of the invention.

What is claimed is:

1. A semiconductor device, comprising:
   a semiconductor substrate having a first surface and a second surface which is positioned on the opposite side of the first surface;
   a through hole which is formed in the semiconductor substrate to connect the first surface and the second surface;
   an active layer which is formed on the first surface of the semiconductor substrate to close the through hole;
   an insulating layer which covers an inner wall surface of the through hole, a bottom surface of the through hole which is closed by the active layer and the second surface of the semiconductor substrate;
   a first opening which is formed in the insulating layer which is present on the bottom surface of the through hole to expose the active layer;
   a second opening which is formed in the insulating layer which is present on the second surface of the semiconductor substrate to expose the second surface;
   a first wiring layer which is formed via the insulating layer ranging from within the through hole onto the second surface of the semiconductor substrate to connect to the active layer through the first opening; and
   a second wiring layer which is formed on the second surface of the semiconductor substrate to connect to the second surface through the second opening,
   wherein the second wiring layer is directly connected with the second surface of the semiconductor substrate.

2. The semiconductor device according to claim 1, further comprising:
   a first external connection terminal formed on the first wiring layer; and
   a second external connection terminal formed on the second wiring layer.

3. The semiconductor device according to claim 2, wherein the second external connection terminal includes a ground terminal.

4. The semiconductor device according to claim 1, wherein the second wiring layer includes a ground wiring.

5. The semiconductor device according to claim 1, wherein the second wiring layer is arranged to surround the first wiring layer on the second surface of the semiconductor substrate.

6. The semiconductor device according to claim 5, further comprising:
   a first external connection terminal which is formed on the first wiring layer; and
   a second external connection terminal which is formed on the second wiring layer to surround the first external connection terminal.

7. The semiconductor device according to claim 1, wherein a protective layer is formed on the second surface of the semiconductor substrate to cover at least the first and second wiring layers.

8. The semiconductor device according to claim 1, further comprising:
   a third opening which is formed in the insulating layer which is present on the second surface of the semiconductor substrate to expose a peripheral edge portion of the second surface.

9. The semiconductor device according to claim 8, wherein the second surface of the semiconductor substrate is covered with a protective layer which also covers the first and second wiring layers.

10. The semiconductor device according to claim 9, wherein an end portion of the protective layer is recessed from a side surface of the semiconductor substrate to position within the third opening.

11. A semiconductor device, comprising:
    a semiconductor substrate having a first surface and a second surface which is positioned on the opposite side of the first surface;
    a through hole which is formed in the semiconductor substrate to connect the first surface and the second surface;
    an active layer which is formed on the first surface of the semiconductor substrate to close the through hole;
    an insulating layer which covers an inner wall surface of the through hole, a bottom surface of the through hole which is closed by the active layer and the second surface of the semiconductor substrate;

a first opening which is formed in the insulating layer which is present on the bottom surface of the through hole to expose the active layer;

a second opening which is formed in the insulating layer which is present on the second surface of the semiconductor substrate to expose the second surface;

a first wiring layer which is formed via the insulating layer ranging from within the through hole onto the second surface of the semiconductor substrate to connect to the active layer through the first opening; and a second wiring layer which is formed on the second surface of the semiconductor substrate via the insulating layer to surround the first wiring layer which is present on the second surface of the semiconductor substrate, wherein the second wiring layer is directly connected with the second surface of the semiconductor substrate through the second opening.

12. The semiconductor device according to claim 11, further comprising:

a first external connection terminal which is formed on the first wiring layer; and a second external connection terminal which is formed on the second wiring layer to surround the first external connection terminal.

13. The semiconductor device according to claim 11, wherein a protective layer is formed on the second surface of the semiconductor substrate to cover at least the first and second wiring layers.

* * * * *